United States Patent
Yoshihara et al.

(10) Patent No.: US 9,635,751 B2
(45) Date of Patent: Apr. 25, 2017

(54) FLEXIBLE CIRCUIT BODY AND METHOD FOR PRODUCTION THEREOF

(75) Inventors: Hidekazu Yoshihara, Tokyo (JP); Akihiko Matsumaru, Tokyo (JP); Taisuke Kimura, Tokyo (JP); Atsushi Kajiya, Tokyo (JP)

(73) Assignee: Nippon Mektron, Ltd., Minato-Ku (JP)

( * ) Notice: Subject to any disclaimer, the term of this patent is extended or adjusted under 35 U.S.C. 154(b) by 591 days.

(21) Appl. No.: 14/113,480

(22) PCT Filed: Mar. 6, 2012

(86) PCT No.: PCT/JP2012/055713
§ 371 (c)(1),
(2), (4) Date: Dec. 9, 2013

(87) PCT Pub. No.: WO2012/147412
PCT Pub. Date: Nov. 1, 2012

(65) Prior Publication Data
US 2014/0124257 A1    May 8, 2014

(30) Foreign Application Priority Data
Apr. 26, 2011   (JP) .................. 2011-098409

(51) Int. Cl.
*H05K 1/03* (2006.01)
*H05K 1/11* (2006.01)
*H05K 1/02* (2006.01)
*H05K 3/28* (2006.01)
*H05K 1/18* (2006.01)

(52) U.S. Cl.
CPC ............... *H05K 1/02* (2013.01); *H05K 1/023* (2013.01); *H05K 1/183* (2013.01); *H05K 3/285* (2013.01);
(Continued)

(58) Field of Classification Search
CPC ...... H05K 1/0393; H05K 1/118; H05K 1/028; H05K 3/28; H05K 3/281; H05K 1/0366;
(Continued)

(56) References Cited

U.S. PATENT DOCUMENTS 4,069,041 A * 1/1978 Gorling .................... C22B 1/04
  205/583
5,525,760 A * 6/1996 Rohatgi ............... H05K 1/0218
  174/254

(Continued)

FOREIGN PATENT DOCUMENTS

JP    03-214691 A1   9/1991
JP    03-220787 A1   9/1991
(Continued)

OTHER PUBLICATIONS

International Search Report dated Jun. 12, 2012.

*Primary Examiner* — Hoa C Nguyen (57) ABSTRACT

Provided is a highly reliable flexible circuit body in which a flexible wiring board is prevented from wear caused by rubbing, and a method for production of the flexible circuit body. A flexible circuit body includes a flexible wiring board having an insulating film, a wiring layer formed on the insulating film, and an insulating layer formed on the wiring layer. The flexible wiring board is coated with a thermoplastic elastomer.

5 Claims, 7 Drawing Sheets

(52) U.S. Cl.
CPC ............. *H05K 1/028* (2013.01); *H05K 1/185* (2013.01); *H05K 3/281* (2013.01); *Y10T 156/1043* (2015.01)

(58) Field of Classification Search
CPC ................ H05K 1/0271; H05K 1/189; H05K 2201/2009; H05K 3/0058; H05K 1/147; H05K 1/182; H05K 1/023; H05K 1/02; H05K 1/183; H05K 3/285; H05K 1/185; H01L 2224/16; H01L 23/5389; Y10T 156/1043
See application file for complete search history.

(56) References Cited

U.S. PATENT DOCUMENTS

| | | | |
|---|---|---|---|
| 6,027,958 A * | 2/2000 | Vu | H01L 21/568 257/679 |
| 6,333,466 B1 * | 12/2001 | Miyaake | B32B 7/12 174/254 |
| 6,635,827 B2 * | 10/2003 | Yosomiya | H01B 7/0838 174/117 A |
| 8,058,559 B2 * | 11/2011 | Muro | H05K 1/0218 174/254 |
| 2008/0182435 A1 * | 7/2008 | Ho | H01R 35/025 439/77 |
| 2008/0204021 A1 * | 8/2008 | Leussler | G01R 33/3415 324/318 |
| 2009/0025195 A1 | 1/2009 | Kim et al. | |
| 2011/0308841 A1 * | 12/2011 | Kawaguchi | H05K 1/0218 174/254 |
| 2014/0158412 A1 * | 6/2014 | Kido | C08L 63/00 174/254 |

FOREIGN PATENT DOCUMENTS

| | | |
|---|---|---|
| JP | 06-268724 A1 | 9/1994 |
| JP | 08-057792 A1 | 3/1996 |
| JP | 2003-309398 A1 | 10/2003 |
| JP | 2007-294996 A1 | 11/2007 |
| JP | 2009-027138 A1 | 2/2009 |
| JP | 2009-120752 A1 | 6/2009 |

* cited by examiner

FLEXIBLE CIRCUIT BODY AND METHOD FOR PRODUCTION THEREOF

BACKGROUND OF THE INVENTION

Field of the Invention

The present invention relates to a wear-resistant flexible circuit body suitable for movable units such as industrial robots and service robots, and relates to a method for production thereof.

Description of Related Art

In recent years, development of robots is remarkable, and robots capable of performing a variety of motions are appearing. In addition, with respect to wearable electronic equipment which can be fitted or attached to a human body or clothing, many varieties of such equipment are developed. Many electric wires for supplying electric power or for transmitting signals are used in these robots and wearable electronic equipment, but in general, an electric wire is constructed such that it has a copper wire as a core, with its outer periphery covered by an insulating material, so the electric wire itself has almost no elasticity. For this reason, it is necessary to arrange an electric wire while providing a margin so as not to obstruct the motion of a robot or a human body, which becomes an obstacle to the design of devices or practical use in many cases.

In particular, in equipment such as a front line humanoid type robot, a power assisted device which is worn or fitted on a human body so as to assist muscular power, many electric wires for operating end motors by way of multiple degree of freedom joints, respectively, and many electric wires for transmitting signals from various kinds of sensors arranged at end points are wired, and in order to enhance the degree of freedom of such wiring in the multiple degree of freedom joints, the demand with respect to those electric wires which are constructed to be elastic or expandable and contractable is increasing more and more.

On the other hand, in recent years, many arm robots are used as industrial robots. In this kind of arm robots, it is required that electrical cables for supplying electric power or for transmitting signals used for an end effector mounted on a tip side of a robot arm, a joint part of a robot arm, etc., be arranged to extend from a root side of a robot arm to a tip side thereof. In addition, depending on the drive form of the end effector or the joint part of the robot arm, it may be necessary to arrange an air (pneumatic) hose or a hydraulic pressure hose from the root side of the robot arm to the tip side thereof.

Accordingly, with the conventional arm robot, in cases where various kinds of cables such as an electrical cable, an air hose, a hydraulic hose, etc., are arranged in a joint part, in order to prevent bending or breaking (disconnection) of the cables, an extra length part is provided. In the extra length part, there is adopted a wiring technique in which the cables are once taken out to the outside in a base end side position of the joint part of the robot arm so that the cables are arranged in an outside space of the joint part, and then the cables are again introduced into the arm in a position which is nearer to its tip end than the joint part. In addition, there has also been known a construction in which a support rod is arranged at the position of the center of joint rotation in the joint part of the arm robot, and the support rod around which a cable has been wound in advance is received inside the robot arm so as to prevent bending or breaking (disconnection) of the cable (see, for example, the first patent document).

However, in the technique of arranging a cable in an outside space of a robot arm, a space for slacking the cable is required in the surrounding of the joint part of the robot arm. Further, there is a fear that at the time of the rotary operation of the joint part of the robot arm, the cable may be damaged and disconnected by being subject to an excessive force or interfering with the robot arm. In addition, in cases where the support rod is arranged in the position of the center of joint rotation, as disclosed in the first patent document, there are the following problems. In other words, the demand for expandable and contractible cables that make it possible to solve such a problem has also increased in the field of arm robots.

A flexible wiring board shaped in a zigzag or coil shape has been suggested to meet such a demand relating to the cables configured to be expandable and contractible. By using such a flexible wiring board, it is possible to increase the degree of freedom in wiring, without unnecessarily increasing the wiring length. Further, in the above-described robot arm, the cable can be prevented from damage and disconnection, without the necessity to provide a space for loosening the cable.

First Patent Document: Japanese patent application laid-open No. H8-57792

Second Patent Document: Japanese patent application laid-open No. H3-220787

However, the following problems are associated with the conventional flexible wiring boards. In the convention flexible wiring boards, a wiring layer is formed on the insulating film serving as a base layer, and an insulating layer is coated on the wiring layer. However, although an expandable and contractible flexible wiring board can be obtained by shaping into a zigzag shape, when the flexible wiring board catches on the surrounding components or rubs thereagainst, the wiring layer can be peeled off and disconnected and the flexible wiring board itself can be damaged.

Further, for example, when the flexible wiring board is used for a joint of a robot arm, the wiring layer can be disconnected and peeled off or the flexible wiring board itself can be damaged by large external forces, such as impacts and vibrations, acting upon the flexible wiring board.

Further, in addition to the flexible wiring board formed into a zigzag shape, a method for obtaining an expandable-contractible wave-shaped flexible circuit body is also known by which, for example, a band-shaped non-vulcanized rubber substrate is superimposed on the front and rear surfaces of a band-shaped wiring conductor in which slit copper foils or copper twisted wires are arranged in parallel, thereby shaping a flat circuit board, and the flat circuit board is then processed into the wavy shape in the lamination direction thereof (see, for example, the second patent document). In this case, the substrate should be bent a plurality of times at the production stage. The resultant problem is that the bending processing greatly reduces the adhesion between the laminated layers in the flexible circuit body. As a consequence, the above-described disconnection and peeling of the wiring conductor can occur and the flexible circuit body itself can be damaged. Further, since the vulcanized rubber substrate is heated and pressurized for simultaneous lamination on the flat conductor and shaping, although the zigzag shape can be obtained, a complex shape such as a coil shape is difficult to form.

Thus, in the conventional flexible wiring board, the wiring layer is disconnected and peeled off, or the flexible wiring board itself is damaged when the flexible wiring board comes into contact with the surrounding components or is subjected to a large external force such as impacts and vibrations. As a result, the connection reliability of the flexible wiring board can be lost and the service life of the flexible wiring board is difficult to ensure.

SUMMARY OF THE INVENTION

Accordingly, it is an objective of the present invention to provide a highly reliable flexible circuit body in which a flexible wiring board is prevented from wear caused by rubbing, and a method for production of the flexible circuit body.

In order to attain the above-described objective, the present invention provides a flexible circuit body including a flexible wiring board having an insulating film, a wiring layer formed on the insulating film, and an insulating layer formed on the wiring layer, wherein a thermoplastic elastomer is coated on the flexible wiring board.

In accordance with the present invention, the flexible wiring board is coated with the thermoplastic elastomer and the flexible wiring board can be prevented from wear.

Further, by forming the thermoplastic elastomer into a predetermined shape, it is possible to maintain the state in which the flexible wiring board is bent to a predetermined shape.

Therefore, a three-dimensional shape can be fabricated by bending a straight shape that has a high yield rate.

Further, even when a plurality of flexible wiring boards is stacked, the flexible wiring boards themselves can be prevented from rubbing by coating with the thermoplastic elastomer.

Where the thermoplastic elastomer is laminated on at least one surface of the flexible wiring board, the effect can be obtained by arranging the lamination surface of the thermoplastic elastomer to face the portion to be subjected to rubbing.

A urethane elastomer that excels in mechanical strength and wear resistance is preferred as the thermoplastic elastomer.

Where an expansion-contraction portion bent to a predetermined shape is provided, the wiring can be expanded and contracted, and when the flexible circuit body is used in a moving part of a robot, no extra length is required.

The wear-resistant thermoplastic elastomer may be provided on at least one portion to be subjected to rubbing. Where the wear-resistant thermoplastic elastomer is provided on the expansion-contraction portion, torsion of the flexible wiring board or impacts acting thereupon can be relaxed.

Where the wear-resistant thermoplastic elastomer is laminated after the mounted component of the flexible wiring board has been coated with a thermoplastic resin, the mounted component can be protected from water or water vapor.

By coating the surface of the flexible wiring board with an urethane resin layer or subjecting the surface of the flexible wiring board to plasma treatment, it is possible to improve the bonding strength of the flexible wiring board and the thermoplastic elastomer. Therefore, peeling of the flexible wiring board and the thermoplastic elastomer can be prevented even after shaping to a three-dimensional shape.

The production method in accordance with the present invention includes laminating a thermoplastic elastomer on a flexible wiring board having an insulating film, a wiring layer formed on the insulating film, and an insulating layer formed on the wiring layer, and then forming the thermoplastic elastomer into a predetermined shape at a temperature equal to or higher than a softening point and equal to or lower than a melting point of the thermoplastic elastomer.

As a result, a three-dimensional shape can be shaped in a simple manner.

When the flexible wiring board is provided with a mounted component, a laminated film in which the thermoplastic resin constituting the embedding thermoplastic resin and the wear-resistant thermoplastic elastomer are pasted together is laminated on the flexible wiring board, and the lamination is performed by heating at a fluidization temperature of the embedding thermoplastic resin constituting the embedding resin layer, thereby embedding the mounted component in the embedding thermoplastic resin.

As a result, the wear-resistant thermoplastic elastomer can be laminated without breaking the electric joining portion of the mounted component. Further, since the mounted component and the shaping apparatus come into contact, with the wear-resistant thermoplastic elastomer being interposed therebetween, no heat is directly transferred to the mounted component during heating and the mounted component can be prevented from damage induced by heat.

Where an expansion-contraction material having a shield function of blocking an electric field and/or a magnetic field is laminated on the thermoplastic elastomer, a shielding effect can be obtained in addition to the prevention of rubbing. Further, the number of parts can be decreased and the cost can be reduced. A functional material having a shield function of blocking an electric field and/or a magnetic field may be mixed with the thermoplastic elastomer.

As described hereinabove, the present invention can provide a highly reliable flexible circuit body that can be flexibly deformed and can prevent the flexible wiring board from wear even in rubbing.

DETAILED DESCRIPTION OF THE INVENTION

Hereinafter, modes for carrying out the present invention will be described in detail by way of example with reference to the attached drawings. However, the dimensions, materials, shapes, relative arrangements and so on of component parts described in the following embodiment are not intended to limit the scope of the present invention to these alone in particular as long as there are no specific statements.

Embodiment (1: Schematic Configuration of Flexible Circuit Body)

Figure 1A:
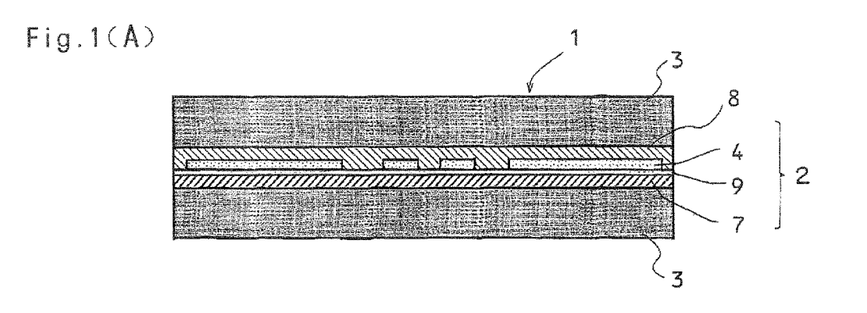
FIG. 1 shows a schematic configuration of the flexible circuit body 1 according to the present embodiment.
Figure 1B:
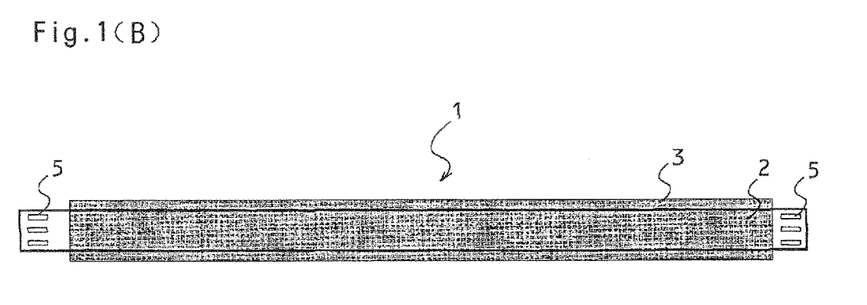

The schematic configuration of a flexible circuit body 1 according to the present embodiment is explained below with reference to FIG. 1. FIG. 1(A) is a schematic sectional view of the flexible circuit body 1; FIG. 1(B) shows a schematic configuration of the flexible circuit body 1.

As shown in FIG. 1(A), the flexible circuit body 1 according to the present embodiment has an insulating film 7 as a base layer, a wiring layer 4 formed on the insulating film 7, with an adhesive layer 9 being interposed therebetween, and an insulating layer 8 formed on the wiring layer 4. The insulating film 7, adhesive layer 9, wiring layer 4, and insulating layer 8 constitute a flexible wiring board which is referred to hereinbelow as "flexible wiring board 2".

At least part of the surface of the flexible wiring board 2, in the present example, the upper surface of the insulating layer 8 and the lower surface of the insulating film 7, is covered by a thermoplastic elastomer 3. The side surfaces of the insulating film 7, adhesive layer 9, wiring layer 4, and insulating layer 8 may be also covered by the thermoplastic elastomer 3 (this configuration is not shown in FIG. 1(A)). In FIG. 1(B), the reference numeral 5 denotes terminals (electrically connectable to the wiring layer 4) provided at both ends of the flexible circuit board 1.

Each of the aforementioned layers is described below in greater detail.

For example, films constituted by a compound of one type selected from polyimides, polyesters, polyamides, polycarbonates, polyarylates, polyphenylene ethers, polyphenylene sulfides, polyethersulfones, polyetherimides, liquid crystal polymers, polyether ether ketones, cyclic polyolefins, polyamidoimides, thermoplastic polyimides, polyethylene terephthalate, and cycloolefin polymers, or laminated films obtained by laminating a plurality of resin films can be used for the insulating film 7 and the insulating layer 8.

The thickness of the insulating film 7 and the insulating layer 8 is preferably 5 µm to 100 µm, more preferably 5 µm to 50 µm. The insulating film 7 and the insulating layer 8 may be made from the same material, or different materials may be selected therefor.

The wiring layer 4 is formed by bonding a well-known metal foil, such as a rolled copper foil, an electrolytic copper foil, or the like, to the insulating film 7 by means of the adhesive layer 9. Alternatively, the wiring layer 4 can also be formed on a surface of the insulating film 7 (or a surface of the adhesive layer 9 formed on the insulating film 7) by means of an appropriate method such as vapor deposition, sputtering, wet plating or the like by using a metal such as copper or silver, and also by means of printing of a conductive paste containing silver or nano-carbon.

The adhesive layer 9 is formed by using a well-known thermoplastic resin such as polyimide, or a well-known thermosetting resin such as cyanate ester based resin, polyphenylene ether based resin, phenol based resin, naphthalene resin, urea resin, amino resin, alkyd resin, silicon resin, furan resin, unsaturated polyester resin, epoxy resin, polyurethane resin, etc. Alternatively, the adhesive layer 9 can also be formed of any of the above-mentioned organic resins with an inorganic filler such as silica, alumina or the like dispersed therein.

A polyurethane elastomer is used as the thermoplastic elastomer 3.

A thermoplastic styrene elastomer, a thermoplastic olefin elastomer, a thermoplastic vinyl chloride elastomer, thermoplastic ester elastomer, a thermoplastic amide elastomer, a thermoplastic 1,2-BR elastomer, and a thermoplastic fluoroelastomer can be used instead of the polyurethane elastomer, but it is preferred that an urethane elastomer that excels in mechanical strength and wear resistance be used. The hardness is preferably JIS (JIS K 7311) A60 or higher to A98 or higher. Whether the hardness is less than JIS A60, undesirable tackiness is demonstrated. Where the hardness is above JIS A98, undesirable fracturing or cracking can occur during deformation. Further, from the standpoint of wear resistance, it is preferred that the hardness be equal to or higher than JIS A80, and from the standpoint of elasticity, it is preferred that the hardness be equal to or less than JIS A95.

The following effects are obtained with the flexible circuit body 1 of the present embodiment.

In accordance with the present invention, the flexible wiring board 2 is protected by the thermoplastic elastomer 3, and the flexible wiring board 2 can be prevented from wear.

Further, by forming the thermoplastic elastomer 3 into a predetermined shape, it is possible to maintain the bendable flexible wiring board 2 in a state of bending into a predetermined shape. Therefore a three-dimensional shape can be produced by bending the flexible circuit body 1 of a straight shape with a good yield rate. Examples of the three-dimensional shape will be described below.

Further, even when a plurality of flexible wiring boards 2 is laminated, the flexible wiring boards 2 themselves can be prevented from scratches by coating with the thermoplastic elastomer 3.

<Surface Coating, Shield Function>

A protective coating such as a UV coating that blocks ultraviolet radiation or an antifouling coating that prevents the surface from contamination may be further provided on the surface of the thermoplastic elastomer 3 (such coating is not shown in the figure).

In addition, a flexible material having a shielding function of blocking an electric field and/or a magnetic field may be further laminated on the thermoplastic elastomer 3. In such a case, scratches can be prevented and a shielding effect can be additionally obtained. Where lamination is performed, the number of components can be decreased and the cost can be reduced. A shielding functional material may be also admixed to the thermoplastic elastomer 3 itself, provided that the resilience of the thermoplastic elastomer 3 itself is not decreased.

(2-1: Production of Flexible Wiring Board 2)

A method for production of the flexible wiring board 2 prior to lamination of the thermoplastic elastomer 3 is explained below with reference to FIG. 2(A) to FIG. 2(C).

Figure 2A:
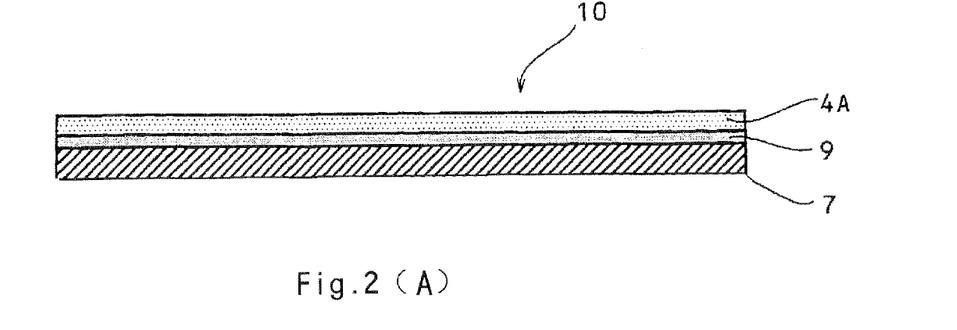
FIG. 2 is schematic diagram illustrating a method for production of the flexible wiring board 2 of the flexible circuit body 1 according to the present embodiment.

First, a metal-covered film 10 is prepared, as shown in FIG. 2(A). The metal-covered film 10 can be formed by forming the adhesive layer 9 on a surface of the insulating film 7, laminating a metal foil 4A on a surface of the adhesive layer 9, and integrating these three layers with one another by means of thermocompression bonding. Here, note that as another technique of forming the metal-covered film 10, there are mentioned a technique of coating a polyimide precursor varnish serving as a base film on a metal foil, and drying/imidizing this precursor, a technique of forming a seed layer on a base film by vapor deposition, sputtering or electroless plating and forming a metal layer by means of electrolysis plating, and so on.

Figure 2B:
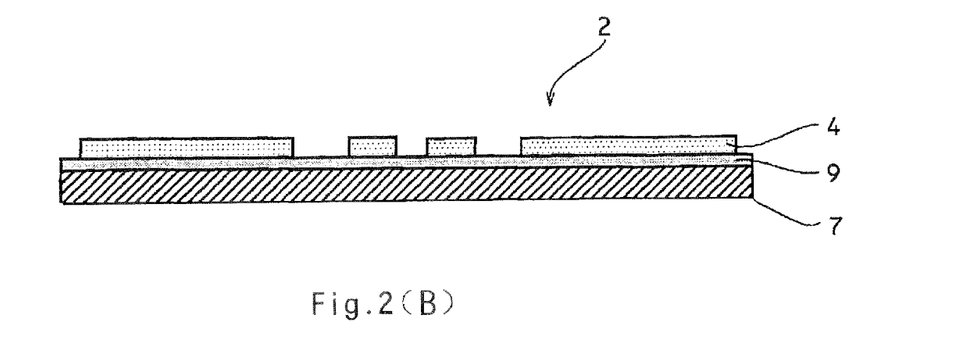
Figure 2C:
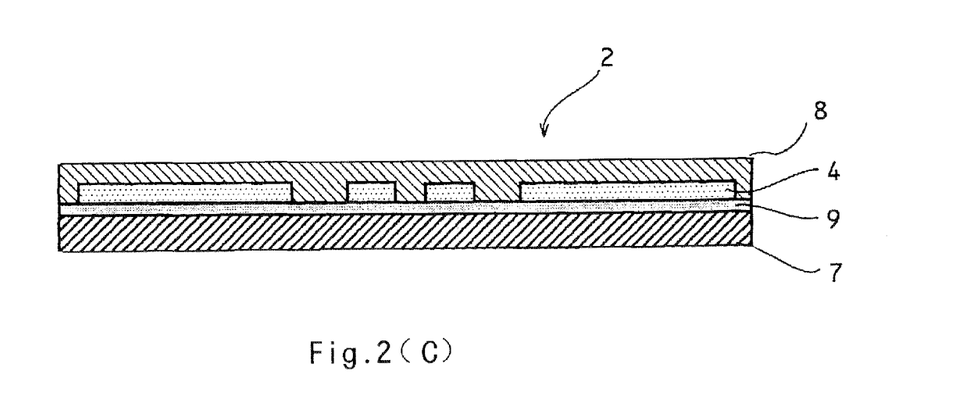

Then, as shown in FIG. 2(B), the wiring layer 4 is formed by etching the metal layer (the metal foil 4A) into a desired pattern. Subsequently, as shown in FIG. 2(C), the flexible circuit body 2 is obtained by bonding the insulating layer 8 having an adhesive layer (not shown) on the wiring layer 4. As mentioned above, the single-sided flexible circuit body 2 having the insulating layer 8 is obtained according to the steps shown in FIG. 2(A) to FIG. 2(C).

The flexible wiring board 2 according to the present embodiment may have not only the above-described single-sided structure, but also a two-sided structure, and a multilayer structure including three or more layers can be also used, provided that flexibility can be maintained.

(2-2: Lamination of the Thermoplastic Elastomer 3)

Then, as shown in FIG. 1(A), the thermoplastic elastomer 3 is laminated on the front surface and/or rear surface of the above-described flexible wiring board 2. In the lamination step, the laminated structure can be obtained by preparing a sheet of the thermoplastic elastomer 3 and thermocompression bonding the sheet of the thermoplastic elastomer 3 to the flexible wiring board 2.

When the adhesion of the flexible wiring board 2 and the thermoplastic elastomer 3 is to be improved, it is desirable that a urethane resin layer be coated on the surface of the flexible wiring board 2, or the surface of the flexible wiring board 2 be treated by plasma treatment.

(2-3: Three-Dimensional Shaping of the Flexible Circuit Body 1)

When a three-dimensional shape is to be obtained, the flexible circuit body 1 with the laminated thermoplastic elastomer 3 is bent to a predetermined shape and heated for a predetermined time at a temperature equal to or higher than the softening point and equal to or lower than the melting point of the thermoplastic elastomer 3, while maintaining the bent shape, thereby shaping the three-dimensional shape. In order to prevent the mounted components from damage by heat, it is preferred that the shaping temperature be equal to or lower than 160 degrees C.

(3-1: The Flexible Circuit Body 1 Provided with Mounted Components and Method for Production Thereof)

Figure 3A:
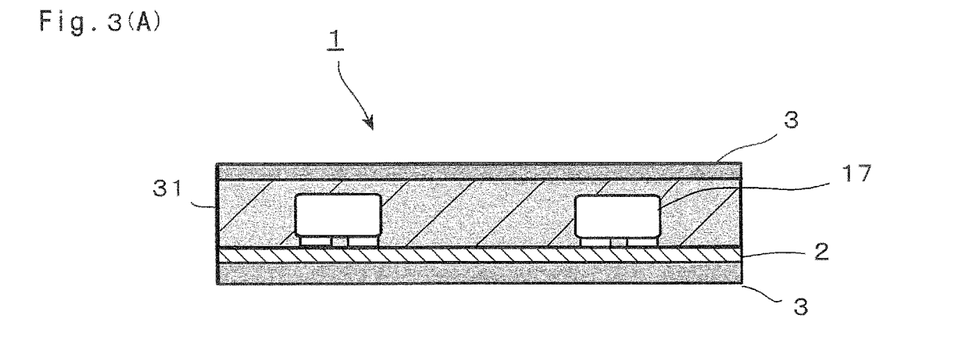
FIG. 3 is schematic configuration diagram illustrating a method for laminating the wear-resistant thermoplastic elastomer 3 on the flexible wiring board 2 provided with mounted components according to the present embodiment.

FIG. 3(A) shows a configuration example of the flexible circuit body 1 provided with mounted components 17.

Since the basic configuration of the flexible wiring board 2 is the same as that of the flexible wiring board 2 shown in FIG. 1, only different features are explained herein. Like components are assigned with like reference numerals and the explanation thereof is herein omitted.

The flexible wiring board 2 is provided with the mounted components 17, and the thermoplastic elastomer 3 is coated on a thermoplastic resin 31 constituting an embedding resin layer for embedding the mounted components 17.

Various sensors such as touch sensors, electronic components such as capacitors and LED are provided as the mounted components 17, the terminals thereof are connected to the wiring layer, and the main body portions are exposed to the outside of the flexible wiring board 2.

The thermoplastic resin 31 constituting the embedding resin layer for embedding the mounted components 17 is a low-hardness thermoplastic resin with a hardness and softening point lower than those of the thermoplastic elastomer 3.

In this example, a two-layer structure is used in which a low-hardness thermoplastic polyurethane resin is used for the thermoplastic resin 31 constituting the embedding resin layer, and a wear-resistant high-hardness thermoplastic polyurethane elastomer capable of preventing tackiness is used for the thermoplastic elastomer 3. The hardness of the high-hardness thermoplastic polyurethane elastomer is preferably equal to or higher than JIS A70 to improve impact resistance and equal to or less than JIS A98 to improve shaping ability. Further, from the standpoint of wear resistance, a hardness equal to or higher than JIS A80 is preferred, and from the standpoint of buffering ability, a hardness equal to or lower than JIS A95 is preferred. The hardness of the low-hardness thermoplastic polyurethane resin is preferably equal to or less than JIS A70, more preferably equal to or less than JIS A60.

From the standpoint of shaping processing, it is important that the difference between softening points (JIS K 7206) of the high-hardness thermoplastic polyurethane elastomer and low-hardness thermoplastic polyurethane resin be equal to or greater than 20 degrees C. In particular, where the softening point of the low-hardness thermoplastic polyurethane resin is lower by 40 degrees C., the flowability of the low-hardness thermoplastic polyurethane resin during heating and shaping is improved and, therefore, the embedding ability of the mounted components 17 is improved.

Where the mounted components 17 are thus embedded, the mounted components can be prevented from impacts when rubbed against the surrounding constituent components.

The same results are also applicable to the flexible wiring board 2 of a multilayer, rather than single-layer, configuration of the wiring layer.

Figure 3B:
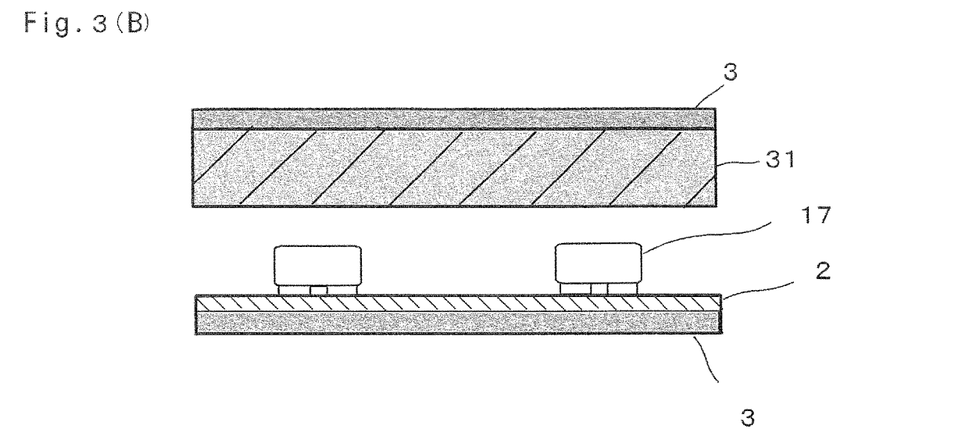

When the flexible circuit body 1 provided with the mounted components 17 is produced, as shown in FIG. 3(B), a laminated film in which the thermoplastic resin 31 constituting the embedding resin layer and the wear-resistant thermoplastic elastomer 3 are pasted together is laminated on the flexible wiring board 2 on the surface having the mounted components 17. Alternatively, the wear-resistant thermoplastic elastomer 3 is laminated on the flexible wiring board 2. The mounted components 17 are embedded in the thermoplastic resin 31 and bonded to the flexible wiring board 2 by heating and pressurizing at a temperature at which the thermoplastic resin 31 constituting the embedding resin layer is fluidized.

(4: Flexible Circuit Body 1 Having Three-Dimensional Shaped Portion)

An example in which the flexible circuit body 1 is bent into a predetermined shape to form a three-dimensional shaped portion is explained below.

(4-1: Embodiment Including Curved Portions)

Figure 4:
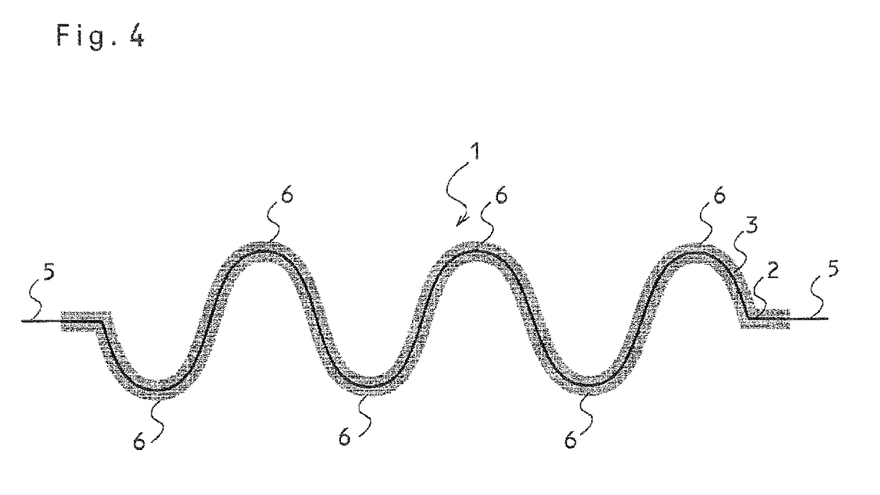
FIG. 4 is schematic configuration diagram illustrating an example in which curved portions 6 are provided at the flexible circuit body 1 according to the present embodiment.

FIG. 4 illustrates an example in which a plurality of curved portions 6 is formed in a pleat-like shape as the three-dimensional shaped portions.

In the flexible circuit body 1 according to the present embodiment, the curved portion 6 is formed in at least one location, thereby providing a configuration such that the entire flexible circuit body 1 can be expanded and contracted (FIG. 4 shows an example in which a plurality of curved portions 6 is provided, but a substantially U-like shape in which the curved portion 6 is provided only in one location may be also used). Further, in the present embodiment, at least the curved portions 6 of the flexible circuit body 1 of such a configuration are covered by the above-described thermoplastic elastomer 3.

FIG. 4 illustrates a case in which almost the entire flexible circuit body 1 is covered by the thermoplastic elastomer 3, but the thermoplastic elastomer 3 may cover at least the curved portions 6. Further, it is not necessary that the upper surface, lower surface, and side surfaces of the curved portion 6 be entirely covered by the thermoplastic elastomer 3, and a sufficient effect in comparison with the conventional configuration can still be obtained by coating anyone surface with the resistant thermoplastic elastomer 3.

Where at least the curved portions 6 are thus covered by the thermoplastic elastomer 3, since the flexible wiring board 2 is not exposed in the curved portions 6, the probability of the wiring layer 4 being disconnected or peeled off and the flexible wiring board 2 being damaged can be reduced by the thermoplastic elastomer 3 functioning as a protective layer even when the flexible circuit body 1 comes into contact with the surrounding components or the like, or when a large external force such as vibrations or impacts acts upon the flexible circuit body 1. In particular, since the curved portions 6 easily become the most protruding portions of the flexible wiring board 2 and, therefore, can easily come into contact with the surrounding components or the like, the above-described configuration is effective in terms of preventing the wiring layer 4 from disconnection or peeling and the flexible wiring board 2 from damage caused by rubbing and friction.

Further, where a material excellent in heat resistance is selected for the thermoplastic elastomer 3, thermal endurance of the flexible circuit body 1 is improved and the flexible circuit body can be used even under a high temperature. Further, where portions other than the curved portions 6 are known in advance to be frequently brought into contact with the surrounding components or the like, the durability of the flexible circuit body 1 can be increased by coating those portions with the thermoplastic elastomer 3. Meanwhile, the production cost and weight of the flexible circuit body 1 can be reduced by not coating the unnecessary portions with the thermoplastic elastomer 3.

Another effect obtained by coating the curved portions 6 with the thermoplastic elastomer 3 is that the shape of the curved portions 6 can be reliably retained due to shape retaining ability of the thermoplastic elastomer 3. Thus, for example, where a large external force such as large tensile stresses acts upon the flexible circuit body 1, the curved portions 6 are expanded and the wiring layer 4 can be disconnected and peeled off. However, with the configuration of the present embodiment, the bent shape of the curved portions 6 can be more reliably retained by the coated thermoplastic elastomer 3. Therefore, even when a large external force acts upon the flexible circuit body 1 and the flexible circuit body is repeatedly subjected to expansion-contraction deformations, the curved portions 6 easily retain their shape (easily restore the original shape even after the expansion). Therefore, it is possible to prevent more reliably the wiring layer 4 from disconnection and peeling and the flexible circuit body 1 from damage.

Further, by attaching the flexible circuit body 1 in a contracted state, it is possible to save the installation space and miniaturize not only the flexible circuit body 1, but also the electronic device.

It is further preferred that the curvature radius R (mm) of the curved portion 6 be equal to or greater than 0.3 mm. According to the comprehensive research conducted by the inventors, where the curvature radius R (mm) is equal to or greater than 0.3 mm, the probability of the disconnection layer 4 being disconnected and peeled off can be further reduced.

As described hereinabove, the flexible circuit body 1 according to the present embodiment is formed in a pleat shape (zigzag shape) having the curved portion 6 with a curvature radius R (mm) in a plurality of locations. When such a shape is used, the flexible circuit body 1 can undergo expansion and contraction deformations, and the entire flexible circuit body 1 is expanded or contracted, thereby preventing local concentration of stresses even when an external force is applied. In addition, the flexible circuit body 1 according to the present embodiment has the following specific features. Thus, usually, where such curved portions are formed in the flexible circuit body 1, stresses are locally concentrated in the curved portions 6 when an external force is applied, the curvature radius of the folded portions changes, and the wiring layer is peeled off or ruptured. However, in the present embodiment, where the flexible circuit body 1 is produced by the below-described production method, it is possible to obtain the flexible circuit body 1 in which the disconnection and peeling of the wiring layer 4 and the damage to the flexible circuit body 1 are prevented more reliably even when an external forces acts.

(4-2: Method for Shaping Curved Portions)

Figure 5A:
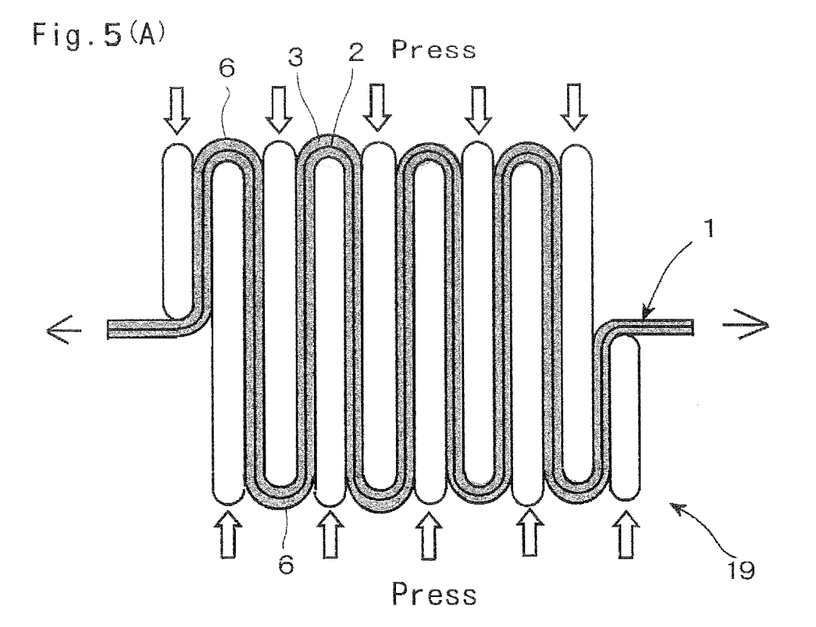
FIG. 5 is a schematic diagram illustrating a method for shaping the curved portions shown in FIG. 4.

With reference to FIG. 5(A), description will be given to a shaping method to form the curved portions 6 with respect to the flexible circuit body 1, after the flexible circuit body 1 has been produced according to the above-mentioned production method.

The method for production of the flexible circuit body 1 according to this embodiment includes a first step to form the curved portions 6 each with a radius of curvature R (mm) by bending the flexible circuit body 1 by means of a shaping device in a state in which tension is applied to opposite ends of the flexible circuit body 1, and a second step to heat at least the curved portions 6 each of the radius of curvature R (mm) which are formed in the flexible circuit body 1. In addition, in this embodiment, as the shaping device, there are provided a plurality of molds 19 (also referred to as partial molds) which are movable with respect to the flexible circuit body 1 from opposite sides thereof in a thickness direction of the flexible circuit body 1, and each of which has a curved portion at its tip.

In the first step, pulling the opposite ends of the flexible circuit body 1 by an unillustrated pulling means, the molds 19 are caused to move, with tension being applied to the opposite ends of the flexible circuit body 1, so that the tips of the molds 19 are pressed against the flexible circuit body 1 from the opposite sides in the thickness direction of the flexible circuit body 1. Because each of the molds 19 is formed at its tip with a curved portion, the plurality of curved portions 6 are formed in the flexible circuit body 1 by pressing the molds 19 against the flexible circuit body 1 from the opposite sides thereof in an alternate manner. The radius of curvature R (mm) of each of the curved portions 6 in this embodiment can be altered by changing the tip shape of each of the molds 19, and similarly, the number of the curved portions 6, the interval of the curved portions 6, and so on can be set optionally by altering the number and the interval of the molds 19 in a suitable manner. Here, note that among the molds 19 arranged on the opposite sides in the thickness direction of the flexible circuit body 1, at least those which are arranged at one side thereof should just be constructed so as to be movable with respect to the flexible circuit body 1. In addition, the pressure applied at the time of pressing the flexible circuit body 1 by the molds 19 should just be an applied pressure by which the curved portions 6 are at least formed in the flexible circuit body 1 in a reliable manner, and the applied pressure can be altered in a suitable manner in accordance with the thickness, the material, etc., of the flexible circuit body 1.

In the second step, with respect to the flexible circuit body 1 in which the plurality of curved portions 6 are formed by means of the molds 19 being pressed thereagainst with tension applied to the opposite ends thereof, at least the curved portions 6 are heated. Although in this embodiment, the flexible circuit body 1 is heated by putting the flexible circuit body 1 with the curved portions 6 formed therein into a heating device together with the molds 19, it may be constructed such that a heating member is arranged in the interior of each of the molds 19, whereby at least the curved portions 6 of the flexible circuit body 1 are heated by the heat generated from the molds 19.

The heating temperature in the present embodiment is such that the surface temperature for the thermoplastic elastomer 3 laminated on the flexible wiring board 2 is equal to or higher than the softening point and equal to or lower than the melting point. As a result of such heating, the thermoplastic elastomer 3 is formed into a curved shape, and the flexible wiring board 2 is maintained in the curved shape by the thermoplastic elastomer 3 and does not return to the original shape.

In the case of the thermoplastic polyurethane elastomer 3, it is preferred that the shaping temperature be equal to or lower than 160 degrees C. in order to prevent the mounted components from being damaged by heat. The heating time differs depending on the bending curvature and type and thickness of the thermoplastic elastomer 3, and can be selected as appropriate. Where the heating time is within 1 hr, the production efficiency can be increased and the degradation of the thermoplastic elastomer 3 and the damage to the wiring layer 4 occurring during long-term heating can be avoided.

Here, note that the first step and the second step may be carried out at the same time. That is, there can also be adopted a method of bending the flexible circuit body 1 by means of the molds 19, while heating those portions which correspond to the curved portions 6.

Figure 5B:
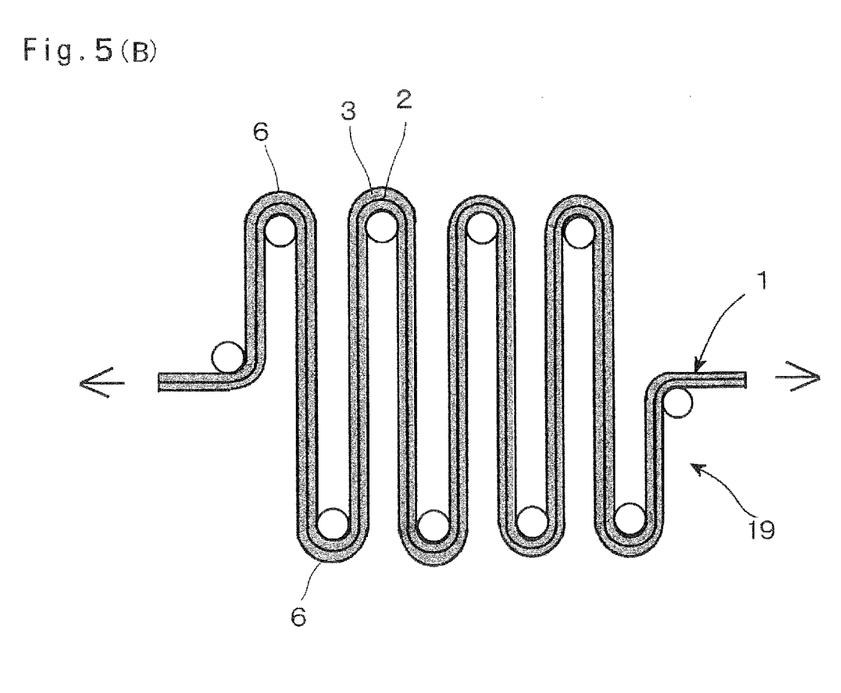

Further, a mold of a pin shape abutting against only the inner circumference of the curved portions, as shown in FIG. 5(B) may be used as the mold 19.

(4-3: Flexible Circuit Body 1 Having a Spiral Part)

Figure 6A:
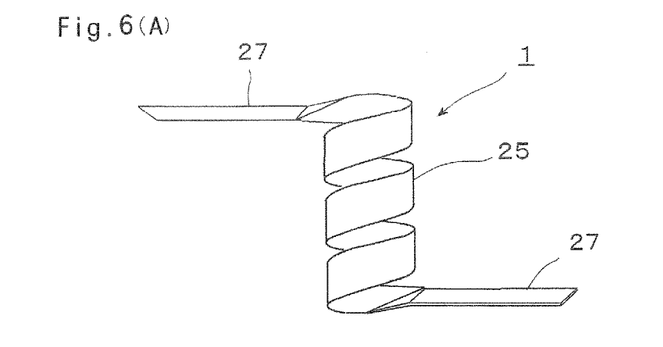
FIG. 6 is a schematic configuration diagram illustrating an example in which a spiral part 25 is provided at the flexible circuit body 1 according to the present embodiment.

FIG. 6 shows the flexible circuit body 1 having a spiral part 25 of a helix shape as the three-dimensional part.

Thus, in an example in which the spiral part 25 is provided as a bent portion in the intermediate portion of the band-shaped flexible circuit body 1, the two ends of the spiral part 25 are flat parts 27.

The spiral part 25 is configured to be expansion-contraction and/or torsion deformable. The reference numeral 26 shown in FIG. 6 stands for a hollow portion of the spiral part 25, and the reference numeral 5 stands for a terminal (electrically connectable to the wiring layer 4) provided at both ends of the flexible circuit board 1.

The boundary portion of the flat part 2 and the spiral part 25 is bent by 90 degrees such that the flat part 27 extends along the central axis direction of the spiral part 25. It goes without saying that it is not always necessary to bend the boundary portion for the flat part 27 and the spiral part 25 and that the flat part 27 may be shaped to extend in the spiraling direction of the spiral part 25.

As for the thermoplastic elastomer 3 coated on the surface of the flexible wiring board 2, the thermoplastic elastomer may be coated on the entire flexible circuit body 1, including the range from the flat part 27 to the spiral part 25, or may be coated only on the spiral part 25.

With the flexible circuit body 1 having the spiral part 25, it is possible to improve further the expansion-contraction ability of the spiral part 25, while further miniaturizing the configuration. Therefore, the dead space in the attachment location of the flexible circuit body 1 can be effectively used, the electronic device can be reduced in thickness and length, and the number of attached parts can be reduced.

Figures 6B, 6C:
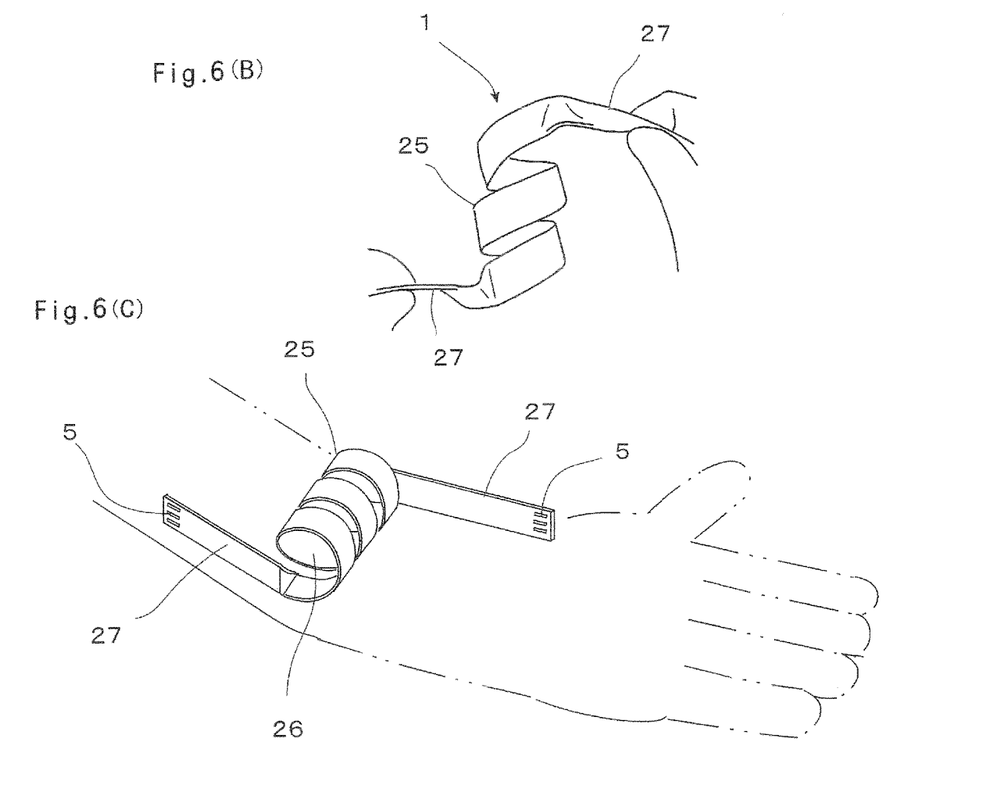

FIG. 6(C) is an image illustrating the application of the flexible circuit body 1 provided with the spiral part 25 to the joint section of a robot.

Thus, as described hereinabove, the spiral part 25 having the hollow portion 26 is provided at at least part of the flexible circuit body 1 according to the present embodiment. Since the flexible circuit body 1 has such a shape, it can be expanded or contracted, and even when an external force is applied thereto, the entire flexible circuit body 1 is expanded or contracted, thereby preventing local concentration of stresses. Since the configuration can undergo torsion deformation, rather than only the expansion-contraction deformation, the degree of freedom in deformation of the flexible circuit body 1 can be further increased. Furthermore, in this case, local concentration for stresses can be also prevented by torsional deformation for the entire spiral part 25. Despite cyclic contraction, expansion and torsion, since the stresses applied to the wiring layer can be relaxed in the entire substrate, the possibility of the wiring layer peeling off or breaking is low and excellent connection reliability can be maintained.

A separate wire can be inserted through the hollow portion 26 of the spiral part 25. In such a case, the dead space of the flexible circuit body 1 can be effectively used, the electronic device can be reduced in thickness and length, and the number of attached components can be reduced.

Further, in the flexible circuit body 1 according to the present embodiment, the spiral part 25 is a portion "formed in a spiral shape". Therefore, the flexible circuit body 1 is shaped such that the spiral shape can be maintained by the flexible circuit body itself, and no external support means or assist means is required. As a result, it is not necessary to provide separately a support rod, as in the conventional cable.

(4-4: Shaping Method for Spiral Part)

The shaping method for the spiral part 25 of the flexible circuit body 1 according to the present embodiment is explained below with reference to FIG. 7.

The spiral part 25 is shaped after the flexible circuit body 1 has been produced by the above-described production method, by subjecting the produced flexible circuit body 1 to predetermined shaping processing.

Figure 7A:
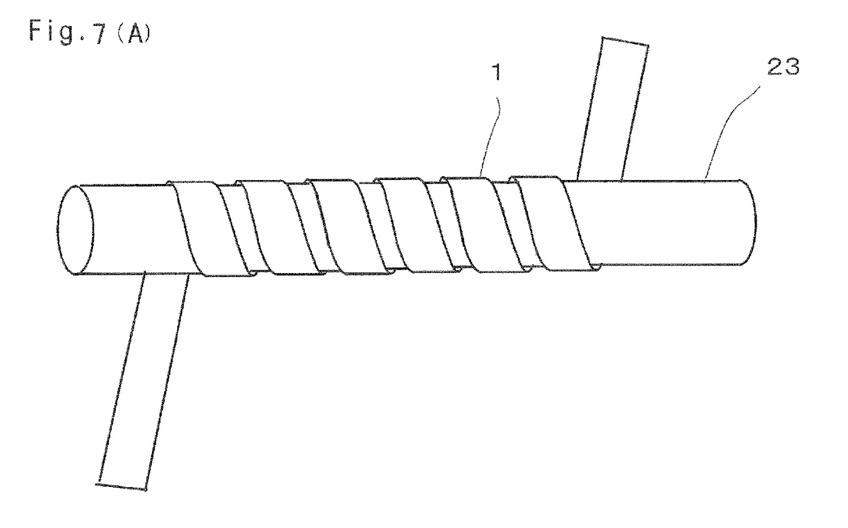
FIG. 7 is a schematic diagram illustrating a method for shaping the spiral part 25 shown in FIG. 6
Figure 7B:
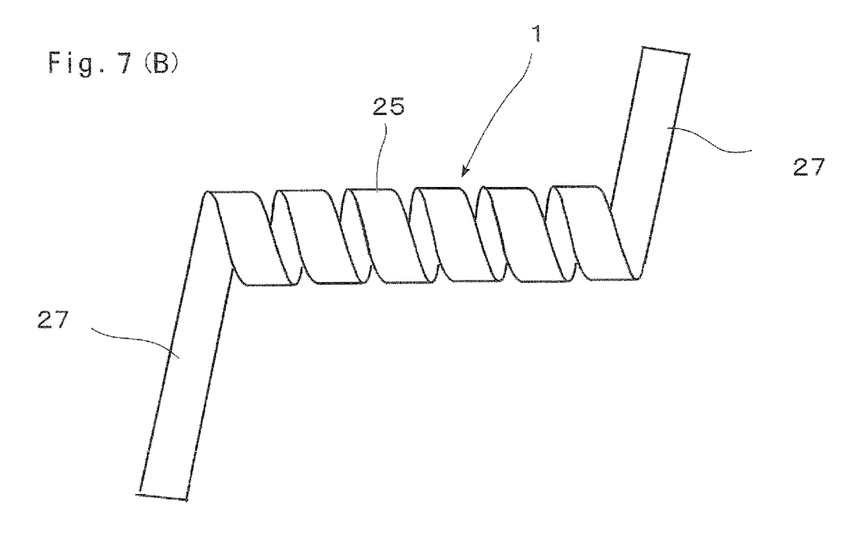

As shown in FIG. 7(A), the shaping processing of the spiral part 25 includes: a first step to wind the flexible circuit body 1 around a shaping device 23 of a circular column shape in a state in which tension is applied to the opposite ends of the flexible circuit body 1, thereby to shape the spiral part 25; and a second step to heat a portion of the flexible circuit body 1 wound around the shaping device 23, thereby to form the spiral part 25 in the flexible circuit body 1.

In the first step, by pulling the opposite ends of the flexible circuit board 1 by means of an unillustrated pulling unit, the flexible circuit body 1 is wound around the shaping device 23, with tension being applied to the opposite ends of the flexible circuit body 1, whereby a portion of the flexible circuit body 1 is shaped into a spiral shape. The size or length in the diametrical direction of the hollow interior portion 26 can be changed by changing the diameter of the shaping device 23, and similarly, the number of turns of the spiral part 25, the interval of adjacent turns of the spiral part 25, and so on, can be set optionally or at will by changing the number of turns and the interval of adjacent turns of the shaping device 23 in a suitable manner. In addition, a tensile force at the time of applying tension to the flexible circuit body 1 should just be an applied force by which the spiral part 25 is at least formed or shaped in the flexible circuit body 1 in a reliable manner, and the applied force can be changed in a suitable manner in accordance with the thickness, the material, etc., of the flexible circuit body 1.

In the second step, the flexible circuit body 1, which is formed into the spiral shape by applying tension to the opposite ends thereof, in particular at least the portion thereof formed into the spiral shape (that portion which is wound around the shaping device 23) is heated. Although in this embodiment, the flexible circuit body 1 formed in the spiral shape is heated by putting the flexible circuit body 1 into a heating device together with the shaping device 23, it may be constructed such that a heating member is arranged in the interior of the shaping device 23, whereby at least that portion of the flexible circuit body 1 which is formed into the spiral shape is heated by the heat generated from the shaping device 23. Thus, by heating the portion of the flexible circuit body 1 formed into the spiral shape in this manner, it is possible to shape or form the spiral part 25 with respect to the flexible circuit body 1.

The heating step is implemented in the same manner as explained with reference to the curved portion 6.

(5: Examination 1 of Effect)

The curved portions 6 were shaped by changing the heating conditions and the thickness of the thermoplastic elastomer 3 in order to examine the effect of the method for production of the flexible circuit body 1 according to the present embodiment.

A thermoplastic urethane elastomer (softening point 115 degrees C., melting point 180 degrees C., hardness JIS A90) was used as the thermoplastic elastomer 3, and the shapes obtained when the flexible circuit bodies 1 with the total thickness of the thermoplastic elastomer 3 of 1 mm and 2 mm were heated for 30 min and 10 min at 160 degrees C. were compared. The results are shown in Table 1 below. In Table 1, the "success or failure in shaping" represents the result obtained in examining as to whether or not a folded portion with a curvature radius R (mm) was formed, after the flexible circuit body 1 has been taken out of the mold 19. In order to evaluate the external appearance of each obtained sample, a "cyclic expansion-contraction test" was performed by causing 100,000 cycles of reciprocal movement in the vertical direction at a rate of 100 mm/sec.

TABLE 1

| | Thickness (mm) | Surface temperature (° C.) | Shaping time (min) | Success or failure in shaping | External appearance |
|---|---|---|---|---|---|
| Sample 1 | 1 | 160 | 10 | Δ | ◯ |
| Sample 2 | 1 | 160 | 30 | ◯ | ◯ |
| Sample 3 | 2 | 160 | 10 | Δ | X |
| Sample 4 | 2 | 160 | 30 | ◯ | X |

In Table 1, the following criteria were used for the success or failure in shaping:

◯: curvature radius is less than ±20% of a design value,

Δ: curvature radius is equal to or greater than ±20% and less than +40% of the design value, X: curvature radius is equal to or greater than ±40% of the design value, and the following criteria were used for the external appearance:

◯: no fractures or cracks are found in the thermoplastic elastomer 3,

X: fractures and cracks are found in the thermoplastic elastomer 3.

Table 1 demonstrates that in Samples 1 and 3, no folded portions were formed in flexible circuit body 1 despite heating. Further, in Sample 4, although heating resulted in the formation of folded portions, the expansion-contraction test confirmed the occurrence of fracture and cracks in the curved portions 6. Thus, optimum results were obtained for Sample 2 with a total thickness equal to or less than 1 mm that was subjected to heating for a predetermined time at a temperature equal to or higher than the softening point and equal to or lower than the melting point for the thermoplastic elastomer 3.

<5: Examination 2 of Effects>

The embedding ability of the mounted component 17 was evaluated by changing the heating conditions with the object of examining the effect of the method for production of the flexible circuit body 1 provided with the mounted component 17 according to the present embodiment.

The embedding ability for the mounted component was compared for the cases of heating for 3 min and 1 min at 160 degrees C. with respect to a flexible circuit body 1 using a wear-resistant thermoplastic urethane elastomer (softening point 115 degrees C., melting point 180 degrees C., hardness JIS A90, total thickness 1 mm) as the thermoplastic elastomer 3, a low hardness thermoplastic polyurethane resin (softening point 60 degrees C., melting point 160 degrees C., hardness JIS A60, thickness 3 mm) as the thermoplastic resin 31, and a LED (thickness 2 mm) as the mounted component 17. the results are shown in Table 2 below.

TABLE 2

| | Heating temperature (° C.) | Heating time (min) | Evaluation of embedding reliability | Evaluation of reliability |
|---|---|---|---|---|
| Sample 5 | 160 | 1 | Δ | ◯ |
| Sample 6 | 160 | 3 | ◯ | ◯ |
| Sample 7 | 180 | 1 | Δ | X |
| Sample 8 | 180 | 3 | ◯ | X |

In Table 2, the following criteria were used for the evaluation of embedding ability:

◯: absolutely no inclusion of air,

Δ: some inclusion of air,

X: inclusion of air, and the following criteria were used for the evaluation of reliability:

◯: the mounted component 17 is not damaged (the LED lights up),

X: the mounted component 17 is damaged (the LED does not light up).

Table 2 demonstrates that in Samples 5 and 7, no inclusion of air into the flexible circuit body 1 was observed despite the heating. In Sample 8, although the embedding ability was good due to the heating, the LED was found to be damaged in the evaluation of reliability. Thus, Sample 6 that was heated for a predetermined time at a temperature equal to or less than 160 degrees C. was optimum in terms of preventing the mounted components 17 from damage caused by heating.

EXPLANATION OF REFERENCE NUMERALS

1 . . . flexible circuit body; 2 . . . flexible wiring board; 3 . . . thermoplastic elastomer; 4 . . . wiring layer; 5 . . . adhesive layer; 6 . . . curved portion; 7 . . . insulating film; 8 . . . insulating layer; 17 . . . mounted component; 25 . . . spiral part; 31 . . . thermoplastic resin.

The invention claimed is:

1. A flexible circuit body comprising a flexible wiring board having an insulating film, a wiring layer formed on the insulating film, and an insulating layer having an adhesive layer formed on the wiring layer, the flexible circuit body being configured to have a wear-resistant thermoplastic elastomer coated on at least part of a surface of the flexible wiring board, and to have an expansion-contraction portion bent to have at least one predetermined curved portion shape that is formed and retained even after expansion and contraction deformation in the flexible wiring board, with the thermoplastic elastomer being provided on at least a portion of the at least one predetermined curved portion shape of the expansion-contraction portion that is subjected to rubbing, wherein the flexible wiring board is provided with a mounted component, and the thermoplastic elastomer is coated on a thermoplastic resin in which the mounted component is embedded, the thermoplastic resin in which the mounted component is embedded is a low-hardness thermoplastic resin with a hardness lower than that of the thermoplastic elastomer, the thermoplastic elastomer is a high-hardness thermoplastic polyurethane elastomer and the low-hardness thermoplastic resin is a low-hardness thermoplastic polyurethane resin, and a hardness of the high-hardness thermoplastic polyurethane elastomer is equal to or higher than JIS A80 and equal to or less than JIS A95, and a hardness of the low-hardness thermoplastic polyurethane resin is equal to or less than JIS A70.

2. The flexible circuit body according to claim 1, wherein the thermoplastic elastomer is laminated on at least one surface of the flexible wiring board.

3. The flexible circuit body according to claim 1, wherein an urethane resin layer is coated on a surface of the flexible wiring board, or the surface of the flexible wiring board is subjected to plasma treatment.

4. The flexible circuit body according to claim 1, wherein an expansion-contraction material having a shielding function of blocking an electric field and/or a magnetic field is laminated on the thermoplastic elastomer.

5. The flexible circuit body according to claim 1, wherein a functional material having a shielding function of blocking an electric field and/or a magnetic field is mixed with the thermoplastic elastomer.

* * * * *